United States Patent
Lakshmanan et al.

(10) Patent No.: US 7,219,317 B2
(45) Date of Patent: May 15, 2007

(54) METHOD AND COMPUTER PROGRAM FOR VERIFYING AN INCREMENTAL CHANGE TO AN INTEGRATED CIRCUIT DESIGN

(75) Inventors: Viswanathan Lakshmanan, Thorton, CO (US); Richard D. Blinne, Ft. Collins, CO (US); Jonathan P. Kuppinger, Windsor, CO (US)

(73) Assignee: LSI Logic Corporation, Milpitas, CA (US)

( * ) Notice: Subject to any disclaimer, the term of this patent is extended or adjusted under 35 U.S.C. 154(b) by 151 days.

(21) Appl. No.: 10/828,408

(22) Filed: Apr. 19, 2004

(65) Prior Publication Data

US 2005/0235234 A1    Oct. 20, 2005

(51) Int. Cl.
G06F 17/50    (2006.01)

(52) U.S. Cl. .......................................... 716/5

(58) Field of Classification Search ............ 716/5, 716/2, 18
See application file for complete search history.

(56) References Cited

U.S. PATENT DOCUMENTS

| | | | | |
|---|---|---|---|---|
| 4,630,219 | A * | 12/1986 | DiGiacomo et al. | 716/9 |
| 6,260,177 | B1 * | 7/2001 | Lee et al. | 716/2 |
| 6,523,162 | B1 * | 2/2003 | Agrawal et al. | 716/19 |
| 6,530,073 | B2 * | 3/2003 | Morgan | 716/18 |
| 6,553,548 | B1 * | 4/2003 | Hekmatpour | 716/5 |
| 6,651,239 | B1 * | 11/2003 | Nikitin et al. | 716/18 |
| 6,910,200 | B1 * | 6/2005 | Aubel et al. | 716/9 |
| 6,922,823 | B2 * | 7/2005 | Tester | 716/10 |
| 2002/0129325 | A1 * | 9/2002 | Tanaka | 716/11 |
| 2003/0163791 | A1 * | 8/2003 | Falbo et al. | 716/2 |
| 2004/0139410 | A1 * | 7/2004 | Ghameshlu et al. | 716/6 |
| 2004/0221253 | A1 * | 11/2004 | Imper et al. | 716/13 |
| 2005/0091627 | A1 * | 4/2005 | Satapathy et al. | 716/12 |
| 2005/0216872 | A1 * | 9/2005 | Sung et al. | 716/5 |
| 2005/0235240 | A1 * | 10/2005 | Tien | 716/11 |
| 2006/0136855 | A1 * | 6/2006 | Hoff et al. | 716/11 |
| 2006/0253813 | A1 * | 11/2006 | Rittman | 716/5 |

* cited by examiner

*Primary Examiner*—Paul Dinh
*Assistant Examiner*—Suchin Parihar
(74) *Attorney, Agent, or Firm*—Eric J. Whitesell (57) ABSTRACT

A method and computer program product for verifying an incremental change to an integrated circuit design include receiving as input an integrated circuit design database and an engineering change order. Objects in the integrated circuit design database are identified and marked to indicate a current state of the integrated circuit design database. The engineering change order is applied to the integrated circuit design database, and the integrated circuit design database is analyzed to generate a list of incremental changes to the integrated circuit design database resulting from the engineering change order. Objects in the integrated circuit design database included in the list of incremental changes are identified and marked to distinguish objects in the integrated circuit design database that were changed from the current state. The marked integrated circuit design database distinguishing the objects that were changed from the current state is generated as output.

20 Claims, 4 Drawing Sheets

METHOD AND COMPUTER PROGRAM FOR VERIFYING AN INCREMENTAL CHANGE TO AN INTEGRATED CIRCUIT DESIGN

BACKGROUND OF THE INVENTION

1. Field of the Invention

The present invention is directed to the design of integrated circuits. More specifically, but without limitation thereto, the present invention is directed to computer algorithms for ensuring that an integrated circuit design conforms to a set of selected design rules for a selected manufacturing technology.

2. Description of Related Art

To ensure that an integrated circuit design meets performance and manufacturability specifications, the integrated circuit design is generally subjected to a design rule check (DRC). The design rule check applies a set of selected design rules to the integrated circuit design. Any design rule violations are detected and reported so that the integrated circuit design may be corrected until all the design rules are satisfied.

SUMMARY OF THE INVENTION

In one embodiment of the present invention, a method of verifying an incremental change to an integrated circuit design includes receiving as input an integrated circuit design database and an engineering change order. Objects in the integrated circuit design database are identified and marked to indicate a current state of the integrated circuit design database. The engineering change order is applied to the integrated circuit design database, and the integrated circuit design database is analyzed to generate a list of incremental changes to the integrated circuit design database resulting from the engineering change order. Objects in the integrated circuit design database included in the list of incremental changes are identified and marked to distinguish objects in the integrated circuit design database that were changed from the current state. The marked integrated circuit design database distinguishing the objects that were changed from the current state is generated as output.

In another embodiment of the present invention, a computer program product for verifying an incremental change to an integrated circuit design includes a medium for embodying a computer program for input to a computer and a computer program embodied in the medium. The computer program causes the computer to perform steps that include receiving as input an integrated circuit design database and an engineering change order. Objects in the integrated circuit design database are identified and marked to indicate a current state of the integrated circuit design database. The engineering change order is applied to the integrated circuit design database, and the integrated circuit design database is analyzed to generate a list of incremental changes to the integrated circuit design database resulting from the engineering change order. Objects in the integrated circuit design database included in the list of incremental changes are identified and marked to distinguish objects in the integrated circuit design database that were changed from the current state. The marked integrated circuit design database distinguishing the objects that were changed from the current state is generated as output.

BRIEF DESCRIPTION OF THE DRAWINGS

The present invention is illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

The performance specifications of integrated circuits such as application-specific integrated circuits (ASICs) are often modified during the design cycle by engineering change orders (ECOs). A disadvantage of previous methods of design rule checking is that all of the design rule checks are generally applied to the entire integrated circuit design after implementing each engineering change order, even though the engineering change order typically affects only a small portion of the integrated circuit design. The repeated design rule checks of the entire integrated circuit design for each engineering change order constitute a major bottleneck in the turnaround time (TAT) required to release the integrated circuit design for manufacturing. As integrated circuit design schedules become more aggressive, previous methods for design rule checking become more inefficient. For example, the turnaround time for an engineering change order is typically about 70 hours of computer runtime that may require a week in real time. On the other hand, the success of a design team depends on both its ability to implement engineering change orders in a timely fashion and the validation of the changes to the integrated circuit design in accordance with the physical design rules to ensure a high yield under typical process variations that occur during manufacturing of integrated circuits.

An engineering change order is a deliberate and explicit change to an integrated circuit design. In general, an engineering change order also results in unintended and implicit changes in the integrated circuit design. For convenience, deliberate changes are referred to herein as direct incremental changes, and unintended changes are referred to as indirect incremental changes. The term "incremental" is used to indicate the portion of the integrated circuit design that includes the direct or indirect changes.

An important feature of the present invention is that both direct and indirect incremental changes to a circuit design are identified so that when the circuit design is streamed out, objects in the circuit design that were modified by the engineering change order are distinguished from objects in the circuit design that were not affected by the engineering change order. Special design rule decks may then be used in conjunction with the streamed out design to validate only the portion of the integrated circuit design that is affected by the incremental changes, resulting in a substantial reduction in turnaround time required to validate an integrated circuit design that has been modified by an engineering change order.

Figure 1:
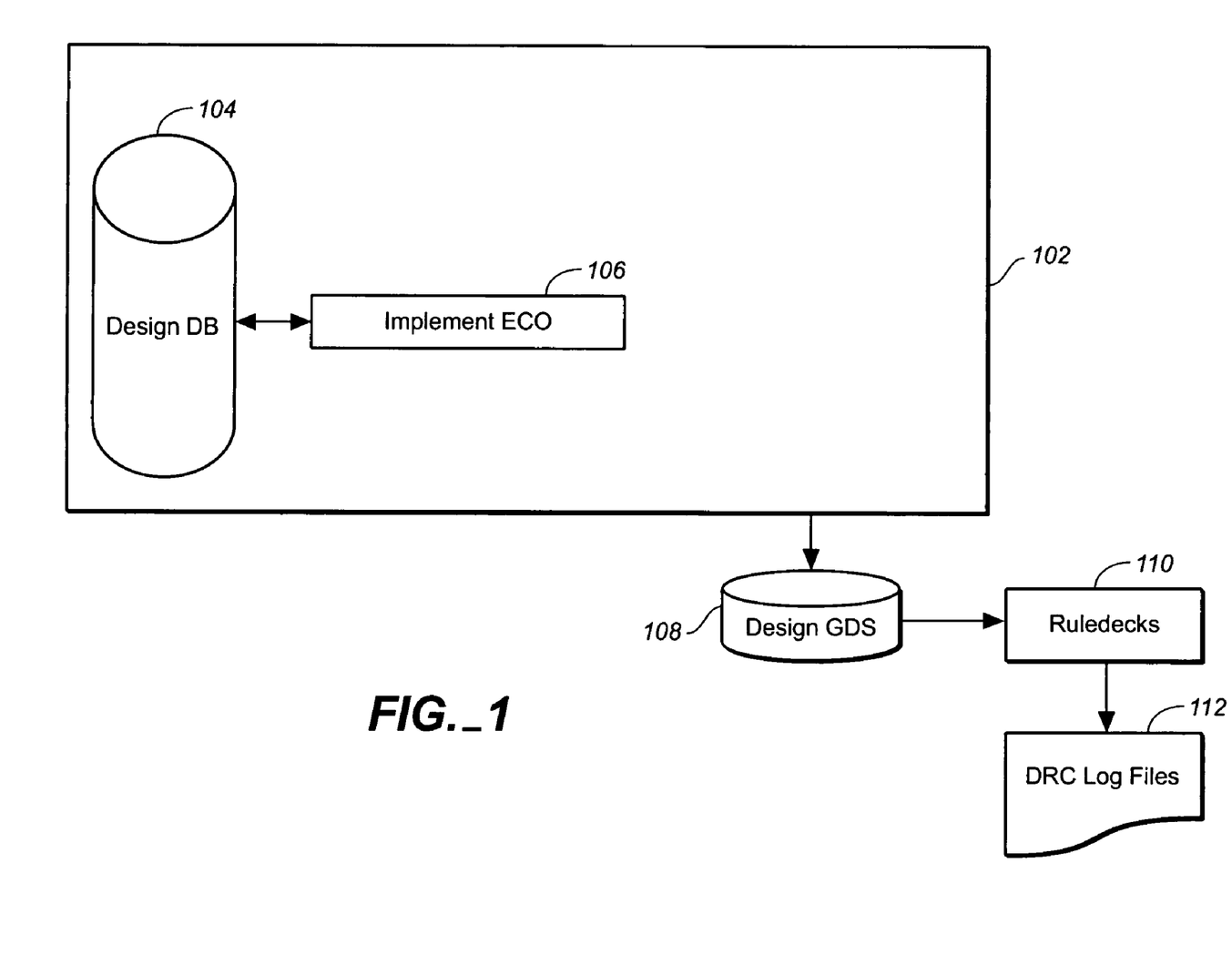
FIG. 1 illustrates a typical computer program flow for verifying an incremental change to an integrated circuit design according to the prior art.

FIG. 1 illustrates a typical computer program flow for implementing an engineering change order according to the prior art. Shown in FIG. 1 are a place and route environment 102, a design database 104, an engineering change order implementation block 106, a design block 108, a standard rule deck 110, and design rule check log files 112.

In FIG. 1, the place and route environment 102 contains the blocks used in the floorplanning, routing and timing validation of the integrated circuit design. The design database 104 contains the netlist information defining the cell placement and routing of cell interconnections in an integrated circuit design, cell libraries defining the structure and performance characteristics of the cells, and other information objects that are used to construct the integrated circuit design. The engineering change order implementation block 106 communicates changes to the integrated circuit design and feedback to the circuit designer via a bi-directional interface with the design database 104. Changes to the integrated circuit design include updates to the design database 104 when cells and routing used in the integrated circuit design are added, deleted, or modified based on the type of engineering change order.

A functional engineering change order corresponds to a netlist change that alters the function of the integrated circuit design. For example, an OR gate may be replaced with an AND gate. A timing engineering change order corresponds to a netlist change that alters the propagation delay of a net. For example, a buffer cell having a drive capability of 10 gates may be replaced by a buffer cell having a drive capability of 100 gates to reduce propagation delay in a net. Also, buffer cells may be added in a long net to reduce propagation delay.

The design block 108 is representative of the integrated circuit design in a GDSII (generic data stream) format, which is a binary representation of the elements or objects contained in the integrated circuit design. The place and route environment 102 supports the translation of the integrated circuit design physical data into a GDSII file. The GDSII file is used for the physical design validation, that is, the validation of the physical design as it pertains to process rules and manufacturability for a selected technology. The standard rule deck 110 contains a selected set of design rules, for example, maximum interconnect length, that are applied in a design rule check to ensure that the integrated circuit design conforms to the standards required to meet performance and manufacturability specifications. The design rule check log files 112 record the results of the design rule check. If rule violations are detected, then the integrated circuit design is modified until the selected design rules in the standard rule deck 110 are satisfied.

A disadvantage of the method illustrated in FIG. 1 is that each engineering change order requires performing another design rule check on the entire integrated circuit design, which may delay release of the integrated circuit design to manufacturing by a week or more for each engineering change order. An important aspect of the present invention is that only the portion of the integrated circuit design that is affected by an engineering change order is subjected to a design rule check, thereby avoiding the unnecessary repetition of checking the typically much larger portion of the integrated circuit design that is not affected by the engineering change order.

In one embodiment of the present invention, a method of verifying an incremental change to an integrated circuit design includes steps of:

(a) receiving as input an integrated circuit design database;

(b) receiving as input an engineering change order;

(c) identifying and marking objects in the integrated circuit design database to indicate a current state of the integrated circuit design database;

(d) applying the engineering change order to the integrated circuit design database;

(e) analyzing the integrated circuit design database to generate a list of incremental changes to the integrated circuit design database resulting from the engineering change order;

(f) identifying and marking objects in the integrated circuit design database included in the list of incremental changes to distinguish objects in the integrated circuit design database that were changed from the current state; and (g) streaming out the integrated circuit design database.

Figure 2:
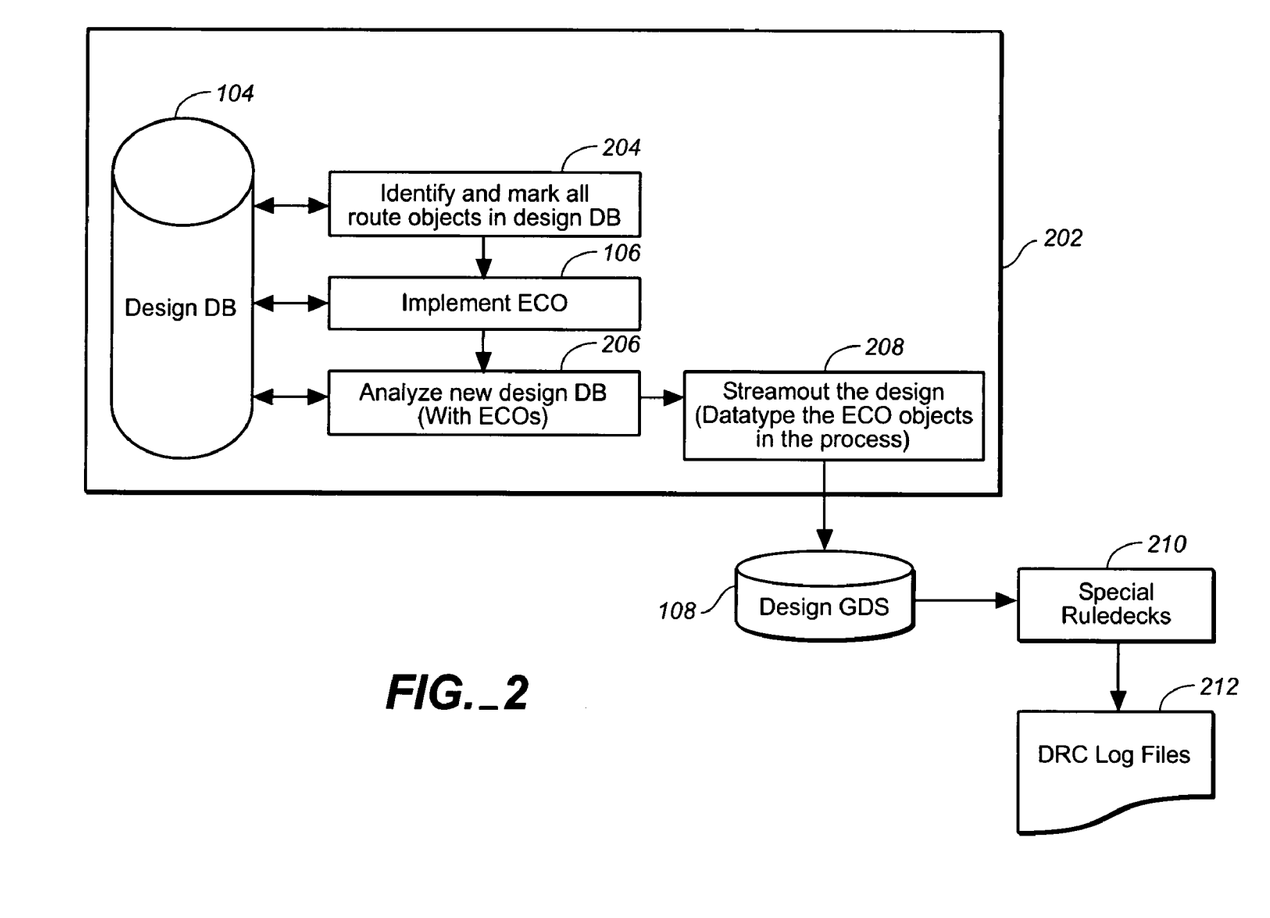
FIG. 2 illustrates a computer program flow for verifying an incremental change to an integrated circuit design according to an embodiment of the present invention.

FIG. 2 illustrates a computer program flow for implementing an engineering change order according to an embodiment of the present invention. Shown in FIG. 2 are a design database 104, an engineering change order implementation block 106, a design block 108, a place and route environment 202, an object identification block 204, an analysis block 206, a design streamout block 208, special design rule decks 210, and design rule check log files 212.

The integrated circuit design database 104 contains the netlist information defining the cell placement and routing of cell interconnections in an integrated circuit design, cell libraries defining the structure and performance characteristics of the cells, and other information objects that are used to construct the integrated circuit design. The engineering change order implementation block 106 communicates changes to the integrated circuit design database 104 and feedback to the circuit designer via a bi-directional interface with the design database 104. Changes to the integrated circuit design include updates to the integrated circuit design database 104 when cells and routing used in the integrated circuit design are added, deleted, or modified based on the type of engineering change order.

In FIG. 2, the place and route environment 202 has been modified to include the object identification block 204, the analysis block 206, and the design streamout block 208. In the object identification block 204, all the objects in the integrated circuit design database 104 are annotated with a specific property, for example, each object in the integrated circuit design database 104 may be annotated by the specific character string "PRE_ECO" to indicate the current state of the integrated circuit design database before implementing the engineering change order. The annotation is preferably made so that a computer program may access cells associated with the specific character string if needed. The place and route environment 202 provides the capability to identify and mark cells and objects in the integrated circuit design database 104. For example, a metal routing layer in the integrated circuit design database 104 may be annotated so that a computer program may differentiate between objects introduced by the engineering change order versus objects that existed before implementing the engineering change order.

In the analysis block 206, the direct and indirect incremental changes to the integrated circuit design resulting from the engineering change order are identified. Identifying the direct and indirect incremental changes includes, for example, identifying physical changes such as relocation of cells in the design layout and re-routing of cell interconnects.

The direct and indirect incremental changes to the integrated circuit design may be identified, for example, by comparing the new cell element list in the design database 104 that incorporates the engineering change order with the previous cell element list before the engineering change order.

Figure 3:
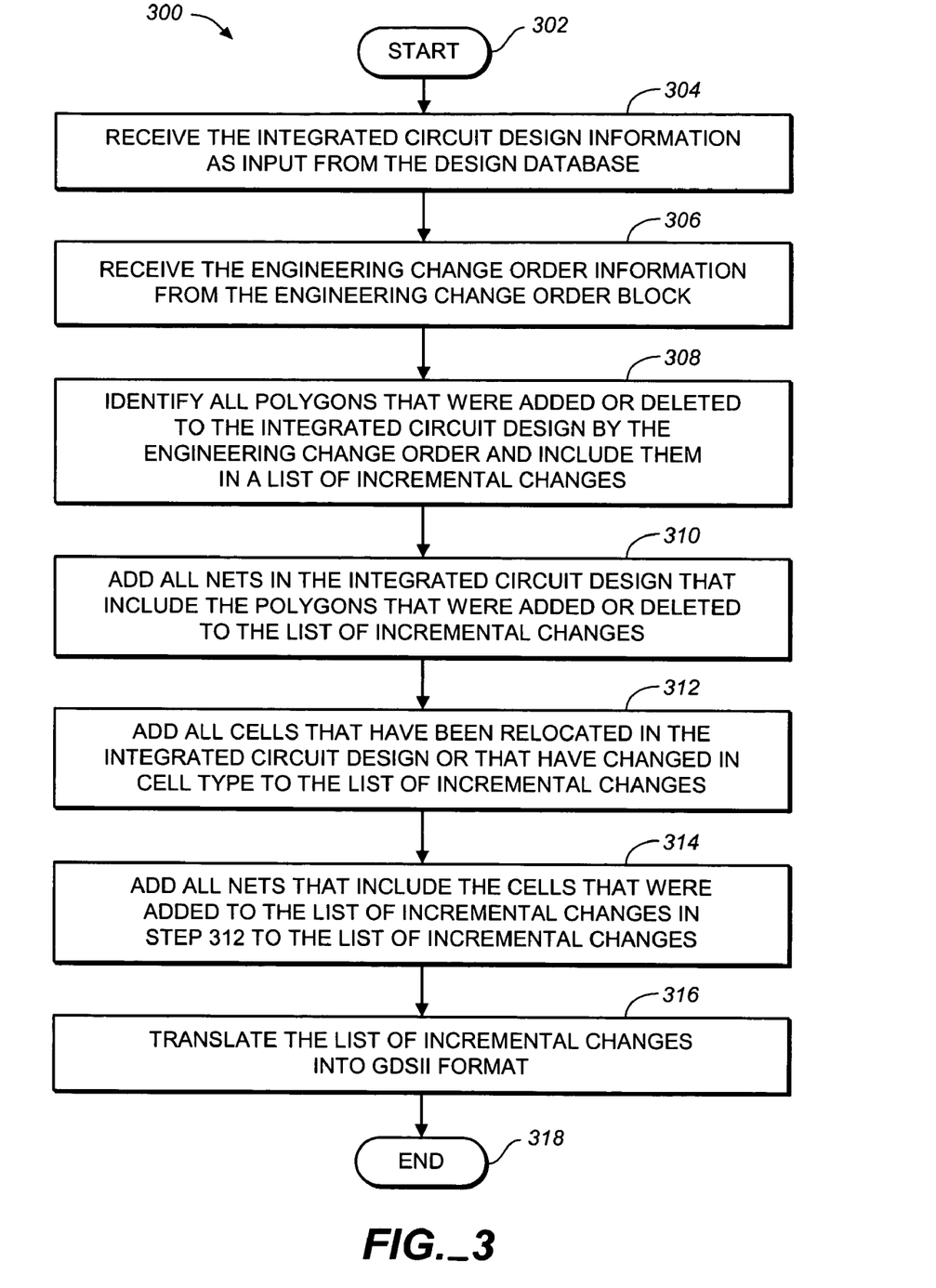
FIG. 3 illustrates a flow chart for a method of identifying direct and indirect incremental changes as an example of the analysis block in FIG. 2.

FIG. 3 illustrates a flow chart 300 for a method of identifying direct and indirect incremental changes as an example of the analysis block 206 in FIG. 2.

Step 302 is the entry point of the flow chart 300.

In step 304, the integrated circuit design information is received as input from the design database 104.

In step 306, the engineering change order information is received as input from the engineering change order block 106.

In step 308, all new polygons that were added to the integrated circuit design by the engineering change order and all polygons that were deleted from the integrated circuit design are identified from the comparison and are included in a list of incremental changes. Polygons are objects that represent the integrated circuit design in the GDSII file format. Specifically, all design components including cells and routing are translated into polygon structures wherein each polygon represents a portion of a cell, routing, and so on.

In step 310, all nets in the integrated circuit design that include the polygons that were added or deleted in step 308 are added to the list of incremental changes.

In step 312, all cells that have been relocated in the integrated circuit design or that have changed in cell type are added to the list of incremental changes.

In step 314, all nets that include the cells that were added to the list of incremental changes in step 312 are added to the list of incremental changes. As an option, power nets may be excepted from being added to the list of incremental changes.

In step 316, the list of incremental changes to the integrated circuit design is translated into GDSII format so that the entire integrated circuit design may be streamed out in GDSII format with special identification tags marking the objects in the integrated circuit design that have been changed as a result of the engineering change order. The list of incremental changes includes only the portion of the integrated circuit design in which the function and/or timing of the integrated circuit design was changed or may have been changed by the engineering change order.

Step 318 is the exit point of the flow chart 300.

In the design streamout block 208, the physical representation of the integrated circuit design is translated into a GDSII (generic data stream) file.

The special design rule decks 210 include the design rules for the specific process technology used by the design validation tool to perform a design rule check on the GDSII file that includes the incremental changes to the integrated circuit design from the list of incremental changes generated by the analysis block 206. Because the incremental changes to the integrated circuit design are generally much smaller than the entire integrated circuit design, the number of design rules in the special design rule decks 210 may also be reduced to a subset limited to the checks and design rules required to validate only the incremental changes to the integrated circuit design. As a result, the design rule check may be performed using substantially less computer runtime than that required for the method illustrated in FIG. 1.

The design rule check log files 212 record any design rule violations found during the design rule check. If a design rule violation is found, the circuit designer may revise the integrated circuit design database and repeat the steps described above for the flow chart 300 until all the design rules are satisfied.

Figure 4:
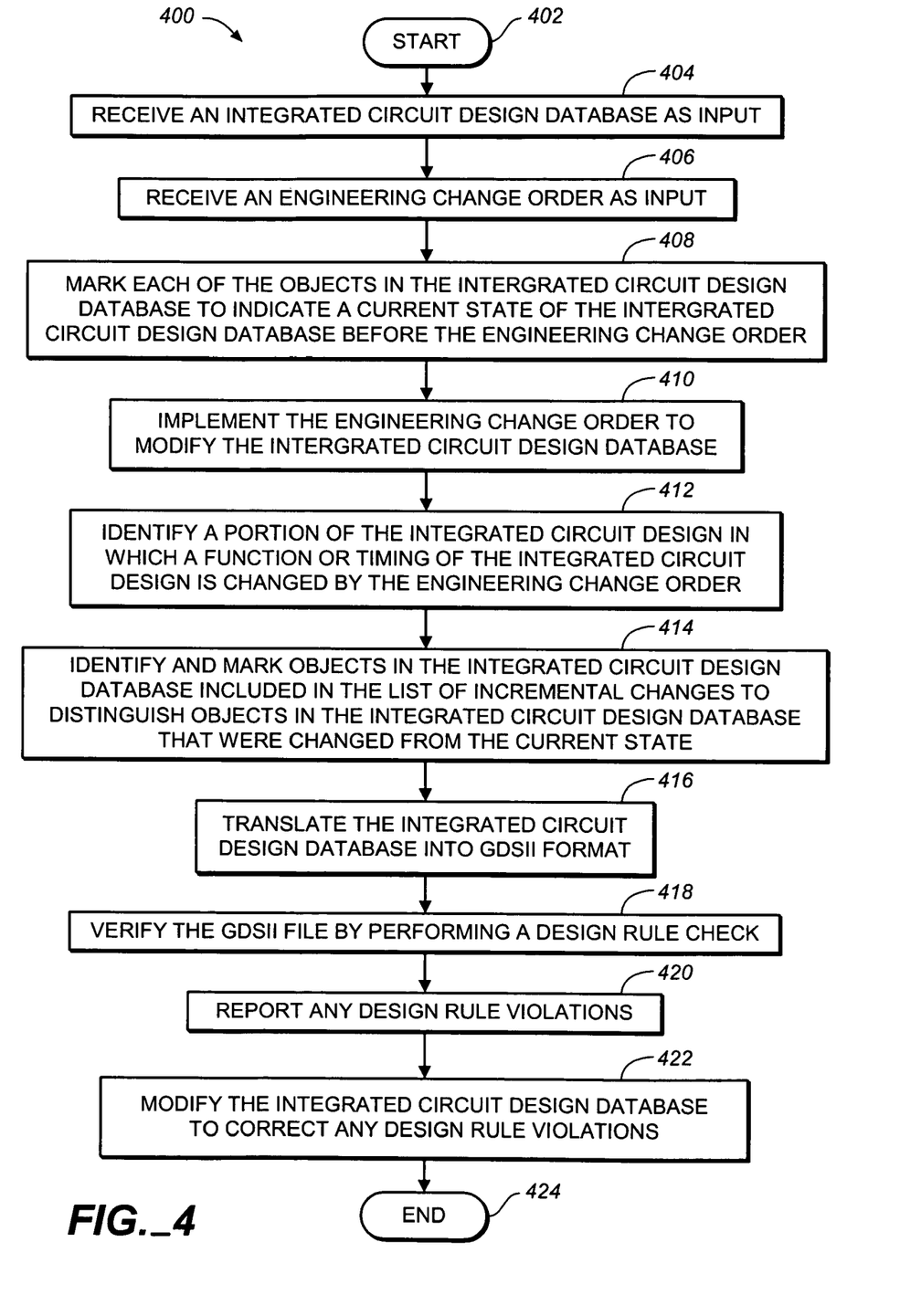
FIG. 4 illustrates a flow chart of a method of verifying an incremental change to an integrated circuit design according to an embodiment of the present invention.

FIG. 4 illustrates a flow chart 400 of a method of verifying an incremental change to an integrated circuit design according to an embodiment of the present invention.

Step 402 is the entry point of the flow chart 400.

In step 404, an integrated circuit design database is received as input according to well-known techniques. The integrated circuit design database includes the cell placement and routing information, cell libraries that define the cell timing characteristics for various semiconductor processes, and other information used in the integrated circuit design.

In step 406, an engineering change order is received as input. The engineering change order includes the netlist and cell changes to the integrated circuit design, for example, to accommodate a change in the performance specifications for the integrated circuit design.

In step 408, each of the objects in the integrated circuit design database is marked to indicate a current state of the integrated circuit design database before the engineering change order. The marking may be, for example, a character string such as "PRE_ECO".

In step 410, the engineering change order is implemented to modify the integrated circuit design database so that the new performance specifications may be met.

In step 412, a portion of the integrated circuit design is identified in which a function or timing of the integrated circuit design is changed by the engineering change order. This step may be performed, for example, by constructing the list of incremental changes as described above by the analysis method described with reference to FIG. 3, or by marking the information objects in the integrated circuit design database 104 that are affected by the engineering change order to populate a text file for post-processing. For example, all objects in the integrated circuit design database 104 that are impacted as a result of the engineering change order may be written out to a separate file.

In step 414, objects in the integrated circuit design database included in the list of incremental changes are identified and marked to distinguish objects in the integrated circuit design database that were changed from the current state. For example, the changed objects may be marked by the character string "POST_ECO_1".

In step 416, the integrated circuit design database is translated into GDSII format that includes the incremental changes to the integrated circuit design marked in a readily identifiable form and streamed out as a GDSII file. The GDSII format is an industry standard that is accommodated by a wide variety of commercially available computer programs for performing a design rule check.

In step 418, the GDSII file is verified by performing a design rule check on the GDSII file according to well-known techniques. A special design rule deck is preferably used that includes only the checks and rules required for the objects of the integrated circuit design that were changed, in contrast to previous methods that perform a full set of design rule checks on the entire integrated circuit design after each engineering change order. Because the design rule check is performed on only the portion of the integrated circuit design that is or may have been changed by the engineering change order, a substantial savings in computer runtime is realized.

In step 420, any design rule violations are reported by the design rule check program, for example, a net having a length that exceeds a maximum net length allowed by the selected design rules in the design rule deck.

In step 422, the integrated circuit design database is modified to correct any design rule violations, for example, by inserting a buffer in a net, until all design rule violations are satisfied.

Step 424 is the exit point of the flow chart 400.

In another embodiment of the present invention, the method of FIG. 2 may be incorporated into a computer program product for verifying an incremental change to an integrated circuit design that includes:

a medium for embodying a computer program for input to a computer; and a computer program embodied in the medium for causing the computer to perform steps of:

(a) receiving as input an integrated circuit design database;
(b) receiving as input an engineering change order;
(c) identifying and marking objects in the integrated circuit design database to indicate a current state of the integrated circuit design database;
(d) applying the engineering change order to the integrated circuit design database;
(e) analyzing the integrated circuit design database to generate a list of incremental changes to the integrated circuit design database resulting from the engineering change order;
(f) identifying and marking objects in the integrated circuit design database included in the list of incremental changes to distinguish objects in the integrated circuit design database that were changed from the current state; and
(g) streaming out the integrated circuit design database.

Although the method of the present invention illustrated by the flowchart descriptions above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method of verifying an incremental change to an integrated circuit design comprising steps of:
    (a) receiving as input an integrated circuit design database;
    (b) receiving as input an engineering change order;
    (c) identifying and marking polygons in a generic data stream file in the integrated circuit design database to indicate a current state of the integrated circuit design database;
    (d) applying the engineering change order to the integrated circuit design database;
    (e) analyzing the integrated circuit design database to generate a list of incremental changes to the integrated circuit design database, the list of incremental changes including all new polygons added to the integrated circuit design and all polygons deleted from the integrated circuit design by the engineering change order;
    (f) adding all cells that have been relocated in the integrated circuit design or that have changed in cell type to the list of incremental changes;
    (g) adding all nets that include the cells that were added to the list of incremental changes in step (f) to the list of incremental changes;
    (h) identifying and marking polygons in the generic data stream file in the integrated circuit design database included in the list of incremental changes to generate a marked integrated circuit design database that distinguishes polygons in the generic data stream file that were changed from the current state; and
    (i) generating as output the marked integrated circuit design database.

2. The method of claim 1 wherein step (i) comprises translating the marked integrated circuit design database to a file in generic data stream format.

3. The method of claim 2 further comprising a step of applying a special rule deck to validate the marked integrated circuit design database wherein the special rule deck includes only design checks and rules applicable to the polygons in the generic data stream file that were changed from the current state.

4. The method of claim 3 further comprising a step of identifying a design rule violation in the polygons in the generic data stream file that were changed from the current state.

5. The method of claim 4 further comprising a step of modifying the marked integrated circuit design database to correct the design rule violation.

6. A computer readable storage medium tangibly embodying instructions for a computer that when executed by the computer implement a method for verifying an incremental change to an integrated circuit design, the method comprising steps of:
    (a) receiving as input an integrated circuit design database;
    (b) receiving as input an engineering change order;
    (c) identifying and marking polygons in a generic data stream file in the integrated circuit design database to indicate a current state of the integrated circuit design database;
    (d) applying the engineering change order to the integrated circuit design database;
    (e) analyzing the integrated circuit design database to generate a list of incremental changes to the integrated circuit design database, the list of incremental changes including all new polygons added to the integrated circuit design and all polygons deleted from the integrated circuit design by the engineering change order;
    (f) adding all cells that have been relocated in the integrated circuit design or that have changed in cell type to the list of incremental changes;
    (g) adding all nets that include the cells that were added to the list of incremental changes in step (f) to the list of incremental changes;
    (h) identifying and marking polygons in the generic data stream file in the integrated circuit design database included in the list of incremental changes to generate a marked integrated circuit design database that distinguishes polygons in the generic data stream file that were changed from the current state; and (i) generating as output the marked integrated circuit design database.

7. The computer readable storage medium of claim 6 wherein step (i) comprises translating the marked integrated circuit design database to a file in generic data stream format.

8. The computer readable storage medium of claim 7 further comprising a step of applying a special rule deck to validate the marked integrated circuit design database wherein the special rule deck includes only design checks and rules applicable to the polygons in the generic data stream file that were changed from the current state.

9. The computer readable storage medium of claim 8 further comprising a step of identifying a design rule violation in the polygons in the generic data stream file that were changed from the current state.

10. The computer readable storage medium of claim 9 further comprising a step of modifying the marked integrated circuit design database to correct the design rule violation.

11. A method of verifying an incremental change to an integrated circuit design comprising steps of:
(a) receiving as input an integrated circuit design database;
(b) receiving as input an engineering change order;
(c) identifying and marking polygons in a generic data stream file in the integrated circuit design database to indicate a current state of the integrated circuit design database;
(d) applying the engineering change order to the integrated circuit design database;
(e) analyzing the integrated circuit design database to generate a list of incremental changes to the integrated circuit design database resulting from the engineering change order;
(f) adding all cells that have been relocated in the integrated circuit design or that have changed in cell type to the list of incremental changes;
(g) adding all nets that include the cells that were added to the list of incremental changes in step (f) to the list of incremental changes;
(h) identifying and marking polygons in the generic data stream file in the integrated circuit design database included in the list of incremental changes to generate a marked integrated circuit design database that distinguishes polygons in the generic data stream file that were changed from the current state; and
(i) generating as output the marked integrated circuit design database.

12. The method of claim 11 further comprising a step of applying a special rule deck to validate the marked integrated circuit design database wherein the special rule deck includes only design checks and rules applicable to the polygons in the generic data stream file that were changed from the current state.

13. A computer readable storage medium tangibly embodying instructions for a computer that when executed by the computer implement a method for verifying an incremental change to an integrated circuit design, the method comprising steps of:
(a) receiving as input an integrated circuit design database;
(b) receiving as input an engineering change order;
(c) identifying and marking polygons in a generic data stream file in the integrated circuit design database to indicate a current state of the integrated circuit design database;
(d) applying the engineering change order to the integrated circuit design database;
(e) analyzing the integrated circuit design database to generate a list of incremental changes to the integrated circuit design database resulting from the engineering change order;
(f) adding all cells that have been relocated in the integrated circuit design or that have changed in cell type to the list of incremental changes;
(g) adding all nets that include the cells that were added to the list of incremental changes in step (f) to the list of incremental changes;
(h) identifying and marking polygons in the generic data stream file in the integrated circuit design database included in the list of incremental changes to generate a marked integrated circuit design database that distinguishes polygons in the generic data stream file that were changed from the current state; and
(i) generating as output the marked integrated circuit design database.

14. The computer readable storage medium of claim 13 further comprising a step of applying a special rule deck to validate the marked integrated circuit design database wherein the special rule deck includes only design checks and rules applicable to the polygons in the generic data stream file that were changed from the current state.

15. A method of verifying an incremental change to an integrated circuit design comprising steps of:
(a) receiving as input an integrated circuit design database;
(b) receiving as input an engineering change order;
(c) identifying and marking polygons in a generic data stream file in the integrated circuit design database to indicate a current state of the integrated circuit design database;
(d) applying the engineering change order to the integrated circuit design database;
(e) analyzing the integrated circuit design database to generate a list of incremental changes to the integrated circuit design database resulting from the engineering change order;
(f) adding all cells that have been relocated in the integrated circuit design or that have changed in cell type to the list of incremental changes;
(g) identifying and marking polygons in the generic data stream file in the integrated circuit design database included in the list of incremental changes to generate a marked integrated circuit design database that distinguishes polygons in the generic data stream file that were changed from the current state; and
(h) generating as output the marked integrated circuit design database.

16. The method of claim 15 further comprising a step of applying a special rule deck to validate the marked integrated circuit design database wherein the special rule deck includes only design checks and rules applicable to the polygons in the generic data stream file that were changed from the current state.

17. A computer readable storage medium tangibly embodying instructions for a computer that when executed by the computer implement a method for verifying an incremental change to an integrated circuit design, the method comprising steps of:
(a) receiving as input an integrated circuit design database;

(b) receiving as input an engineering change order;

(c) identifying and marking polygons in a generic data stream file in the integrated circuit design database to indicate a current state of the integrated circuit design database;

(d) applying the engineering change order to the integrated circuit design database;

(e) analyzing the integrated circuit design database to generate a list of incremental changes to the integrated circuit design database resulting from the engineering change order;

(f) adding all cells that have been relocated in the integrated circuit design or that have changed in cell type to the list of incremental changes;

(g) identifying and marking polygons in the generic data stream file in the integrated circuit design database included in the list of incremental changes to generate a marked integrated circuit design database that distinguishes polygons in the generic data stream file that were changed from the current state; and (h) generating as output the marked integrated circuit design database.

18. The computer program product of claim 17 further comprising a step of applying a special rule deck to validate the marked integrated circuit design database wherein the special rule deck includes only design checks and rules applicable to the polygons in the generic data stream file that were changed from the current state.

19. A method of verifying an incremental change to an integrated circuit design comprising steps of:

(a) receiving as input an integrated circuit design database;

(b) receiving as input an engineering change order;

(c) identifying and marking polygons in a generic data stream file in the integrated circuit design database to indicate a current state of the integrated circuit design database;

(d) applying the engineering change order to the integrated circuit design database;

(e) analyzing the integrated circuit design database to generate a list of incremental changes to the integrated circuit design database resulting from the engineering change order;

(f) identifying and marking polygons in the generic data stream file in the integrated circuit design database included in the list of incremental changes to generate a marked integrated circuit design database that distinguishes polygons in the generic data stream file that were changed from the current state;

(g) generating as output the marked integrated circuit design database including translating the marked integrated circuit design database to a file in generic data stream format; and (h) applying a special rule deck to validate the marked integrated circuit design database wherein the special rule deck includes only design checks and rules applicable to the polygons in the generic data stream file that were changed from the current state.

20. A computer readable storage medium tangibly embodying instructions for a computer that when executed by the computer implement a method for verifying an incremental change to an integrated circuit design, the method comprising steps of:

(a) receiving as input an integrated circuit design database;

(b) receiving as input an engineering change order;

(c) identifying and marking polygons in a generic data stream file in the integrated circuit design database to indicate a current state of the integrated circuit design database;

(d) applying the engineering change order to the integrated circuit design database;

(e) analyzing the integrated circuit design database to generate a list of incremental changes to the integrated circuit design database resulting from the engineering change order;

(f) identifying and marking polygons in the generic data stream file in the integrated circuit design database included in the list of incremental changes to generate a marked integrated circuit design database that distinguishes polygons in the generic data stream file that were changed from the current state;

(g) generating as output the marked integrated circuit design database including translating the marked integrated circuit design database to a file in generic data stream format; and;

(h) applying a special rule deck to validate the marked integrated circuit design database wherein the special rule deck includes only design checks and rules applicable to the polygons in the generic data stream file that were changed from the current state.

* * * * *